United States Patent [19]
Hasegawa

[11] Patent Number: 5,923,192
[45] Date of Patent: Jul. 13, 1999

[54] CMOS CIRCUIT

[75] Inventor: Eiichi Hasegawa, Tokyo, Japan

[73] Assignee: Nippon Precision Circuits Inc., Tokyo, Japan

[21] Appl. No.: 09/030,756

[22] Filed: Feb. 25, 1998

[30] Foreign Application Priority Data

Feb. 26, 1997 [JP] Japan ................................ 9-041882

[51] Int. Cl.⁶ .......................... H03K 1/00; H03K 17/16
[52] U.S. Cl. ...................... 327/112; 327/379; 327/387; 327/389
[58] Field of Search .................................. 327/134, 170, 327/108, 111, 112, 379, 380, 381, 384, 389, 391, 310, 313; 326/26, 27, 83

[56] References Cited

U.S. PATENT DOCUMENTS

| | | | |
|---|---|---|---|
| 5,017,807 | 5/1991 | Kriz et al. | 326/27 |
| 5,214,320 | 5/1993 | Truong | 326/27 |
| 5,218,239 | 6/1993 | Boomer | 326/27 |
| 5,317,206 | 5/1994 | Hanibuchi et al. | 327/108 |
| 5,495,195 | 2/1996 | Fontana et al. | 327/108 |

*Primary Examiner*—Toan Tran
*Attorney, Agent, or Firm*—Jordan and Hamburg LLP

[57] ABSTRACT

A CMOS circuit prevents feedthrough current and has a small-scaled circuit constitution. An output stage has a P-channel MOS transistor and an N-channel MOS transistor with drains connected to each other to form an output terminal and gates respectively connected to output terminals of first and second series circuits. The first and second series circuits control supply of power and each includes an N-channel MOS transistor and a P-channel MOS transistor with drains connected together to form the output terminal and gates connected together to form an input terminal. A delay circuit receives an input signal and produces a delayed input signal which drives the input terminals of the first and second series circuits. P-channel and N-channel MOS transistors control power potentials applied to sources of the respective P-channel and N-channel MOS transistors of the second and first series circuits and are driven by the input signal which is applied to their gates. The P-channel and N-channel MOS transistors are thereby controlled such that current feedthrough is prevented.

2 Claims, 4 Drawing Sheets

CMOS CIRCUIT

BACKGROUND OF THE INVENTION

The present invention relates to a CMOS (Complementary Metal Oxide Semiconductor) circuit.

An output buffer constituted by a CMOS is currently used frequently. As shown by FIG. 3, a basic one is constituted by connecting to each other drains of a P-channel MOS (Metal Oxide Semiconductor) transistor and an N-channel MOS transistor, providing an output terminal at a connection point of these and connecting to each other gates thereof Accordingly, there causes a timing where the P-channel MOS transistor and the N-channel MOS transistor are simultaneously made ON and a feedthrough current is flown between power source terminals VDD and VSS. There has been provided an output buffer disclosed, for example, in Japanese Examined Patent Publication No. JP-B-7-107978 to restrain such a feedthrough current. According to the output buffer, as shown by FIG. 4, drains of a P-channel MOS transistor 20 and an N-channel MOS transistor 40 are connected to each other, an output terminal is provided at a connection point thereof and outputs from inverters 130 and 140 are supplied to gates thereof. Further, an output from an inverter for inputting 120 is outputted to inverters 122 and 124 and the inverters 122 and 124 supply outputs respectively to a transmission gate E constituted by transistors 126 and 128 and a transmission gate F constituted by transistors 136 and 138. The two transmission gates E and F respectively receive the output from the inverter 120 at the gates of the transistors 128 and 136 on one side and receive outputs from inverters 132 and 142 further delaying outputs from the inverters 122 and 124 at the gates of the transistors 126 and 138 on the other side. Thereby in respect of outputs from the transmission gates E and F, rise of the former is made earlier than rise of the latter and fall of the latter is made earlier than fall of the former. Thereby, the transistors 20 and 40 which are respectively made ON and OFF by the inverters 130 and 140 respectively receiving the outputs from the transmission gates E and F, are not made ON simultaneously whereby a feedthrough current is restrained.

However, the circuit of FIG. 4 becomes complicated since the circuit uses 7 of the inverters and 2 of the transmission gates other than 2 of the MOS transistors for outputting whereby the circuit scale is magnified.

SUMMARY OF THE INVENTION

Hence, according to the present invention, gates of two of MOS transistors of a first and a second conductive type for outputting, are respectively connected with output terminals of series circuits in which supply of power source is controlled by MOS transistors of conductive types respectively different from the conductive types of the above-described MOS transistors and in each of which an output terminal is formed by connecting drains of MOS transistors of conductive types different from each other and an input terminal is formed by connecting gates thereof. Further, drive signals of the MOS transistors for supplying power source are constituted by an input signal and the series circuits are driven by drive signals which are delayed in respect of the above-described drive signals. Thereby, OFF timing of one of the MOS transistors for outputting precedes ON timing of the other thereby restraining a feedthrough current.

According to an aspect of the present invention, there is provided a CMOS circuit including a first MOS transistor of a first conductive type where an input signal is received by a gate thereof and a source thereof is connected to a side of a first power source terminal, a second MOS transistor of a second conductive type different from the first conductive type where the input signal is received by a gate thereof and a source thereof is connected to a side of a second power source terminal having a potential different from a potential of the first power source terminal, a delay circuit for delaying the input signal, a first series circuit including a third and a fourth MOS transistor of the first and the second conductive types, gates and drains of which are respectively connected to each other where an output from the delay circuit is received by the gates connected to each other, a source of the third MOS transistor of the first conductive type is connected to a drain of the first MOS transistor, a source of the fourth MOS transistor of the second conductive type is connected to the second power source terminal and an output terminal thereof is constituted by the drains connected to each other, a second series circuit comprising a fifth and a sixth MOS transistor of the first and the second conductive types, gates and drains of which are connected to each other where the output from the delay circuit is received by the gates connected to each other, a source of the sixth MOS transistor of the second conductive type is connected to a drain of the second MOS transistor, a source of the fifth MOS transistor of the first conductive type is connected to the first power source terminal and an output terminal thereof is constituted by the drains connected to each other, and a third series circuit where drains of a seventh MOS transistor of the second conductive type in which an output from the first series circuit is received by a gate thereof and a source thereof is connected to the side of the second power source terminal and an eighth MOS transistor of the first conductive type in which an output from the second series circuit is received by a gate thereof and a source thereof is connected to the side of the first power source terminal, are connected to each other and an output terminal thereof is provided at a point of connecting the drains for outputting an output signal in correspondence with the input signal.

DETAILED DESCRIPTION OF THE INVENTION

Figure 1:
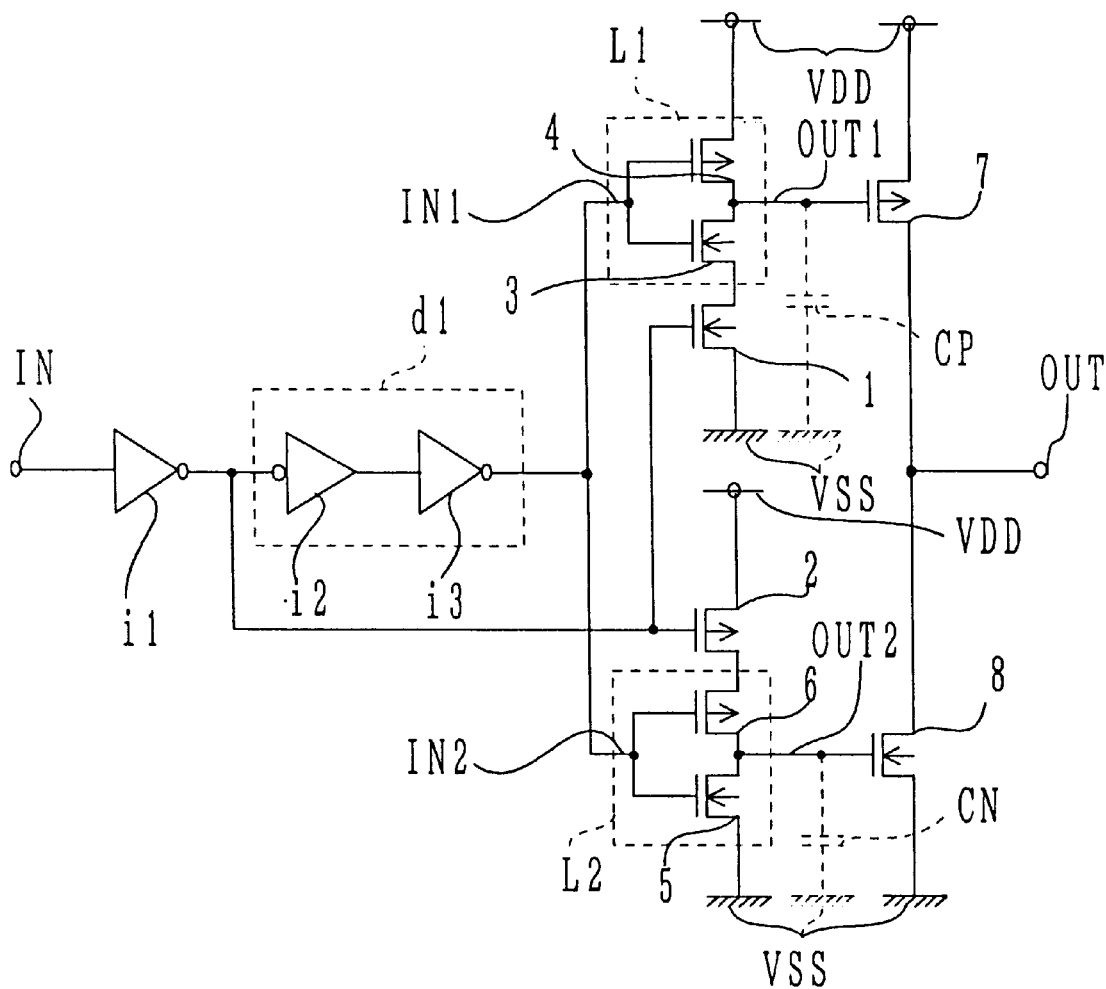
FIG. 1 is an explanatory view showing the constitution of a CMOS circuit according to an embodiment of the present invention.

Next, an explanation will be given of a CMOS circuit according to an embodiment of the present invention. FIG. 1 is an electric circuit diagram for explaining the constitution of the embodiment. In FIG. 1, numerals 1 and 2 respectively designate an N-channel MOS transistor and a P-channel MOS transistor. The source of the N-channel MOS transistor 1 is connected to a power source terminal VSS (0 V) and the source of the P-channel MOS transistor 2 is connected to a power source terminal VDD (5 V) and an input signal is applied to the gates of the MOS transistors 1 and 2 via an inverter i2 for shaping waveform. Notations i2 and i3 designate inverters and the inverters i2 and i3 constitute a delay circuit d1 for successively delaying an output from the inverter i1.

Numerals 3 and 4 designate an N-channel MOS transistor and a P-channel MOS transistor and a first series circuit L1 is constituted by connecting respectively the gates and the drains of these. In this case, the mutually connected gates of the N-channel MOS transistor 3 and the P-channel MOS transistor 4 receive an output from the delay circuit d1 as an input terminal IN1 and an output terminal OUT1 is provided to the drains connected to each other. Further, the drain of the N-channel MOS transistor 1 is connected to the source of the N-channel MOS transistor 3 and the source of the P-channel MOS transistor 4 is connected to the power source terminal VDD.

Numerals 5 and 6 designate respectively an N-channel MOS transistor and a P-channel MOS transistor and a second series circuit L2 is constituted by respectively connecting the gates and the drains of these. In this case, the gates of the N-channel MOS transistor 5 and the P-channel MOS transistor 6 connected to each other, receive the output from the delay circuit d1 as an input terminal IN2 and an output terminal OUT2 is provided to the drains of these connected to each other. Further, the source of the N-channel MOS transistor 5 is connected to the power source terminal VSS and the source of the P-channel MOS transistor 6 is connected to the drain of the P-channel MOS transistor 2.

Numerals 7 and 8 designate respectively a P-channel MOS transistor and an N-channel MOS transistor, an output terminal OUT is provided by connecting the drains of these to each other and the sources of these are respectively connected to the power source terminals VDD and VSS. The gate of the P-channel MOS transistor 7 receives an output from the output terminal OUT1 and the gate of the N-channel MOS transistor 8 receives an output from the output terminal OUT2.

Next, an explanation will be given of the operation of the CMOS circuit of the embodiment constituted as described above in reference to a timing chart of FIG. 2.

Figure 2:
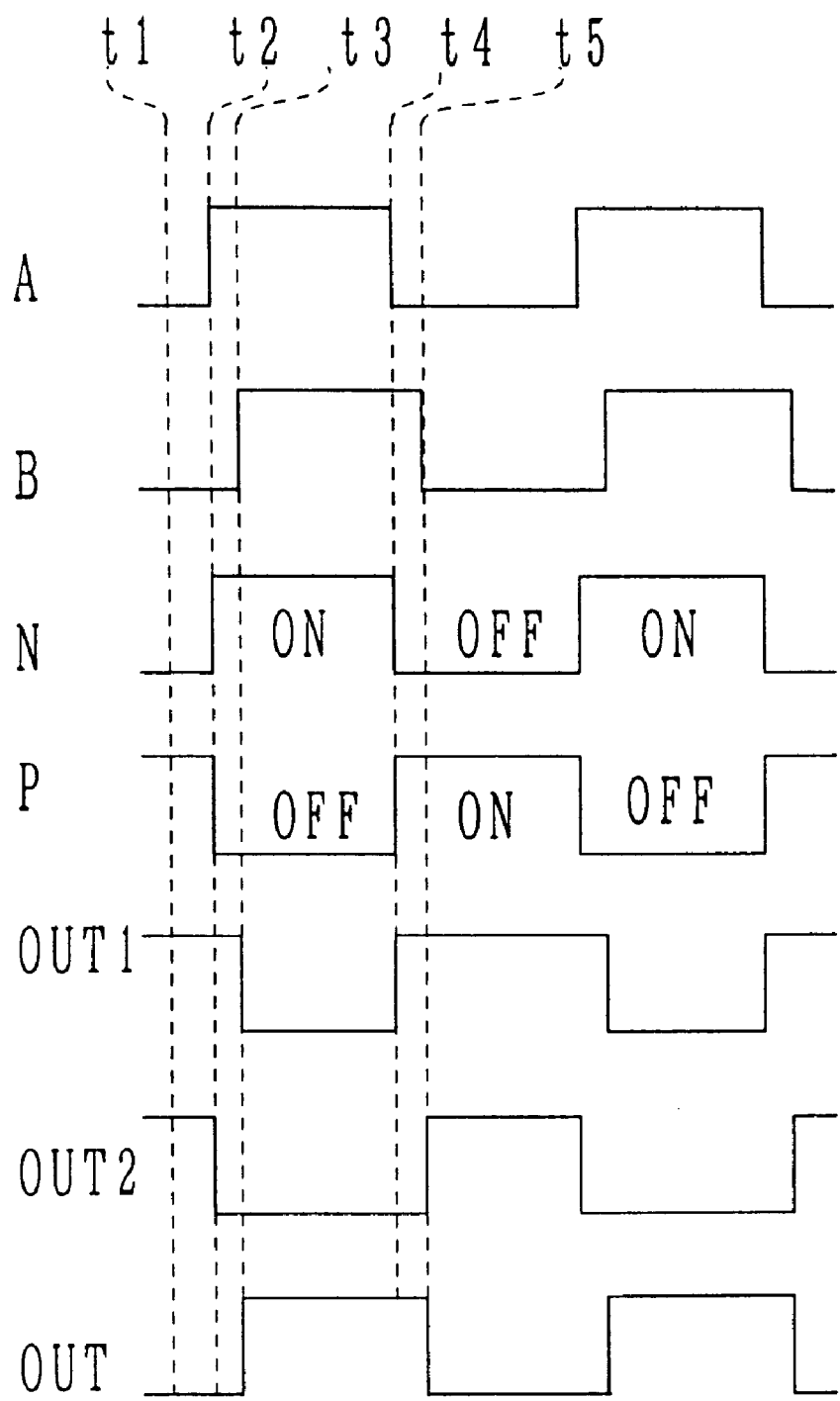
FIG. 2 is a timing chart for explaining the operation of FIG. 1.
Figure 3:
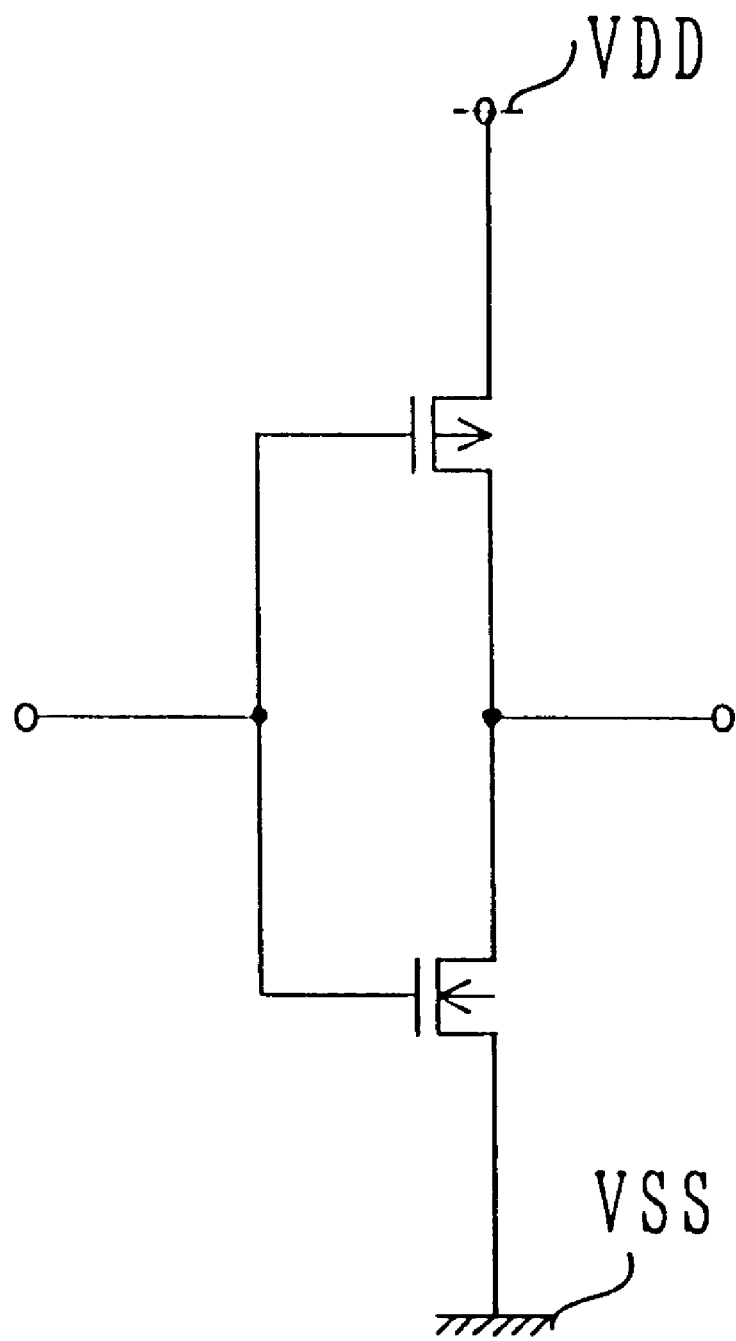
FIG. 3 is an explanatory view for explaining a conventional technology.
Figure 4:
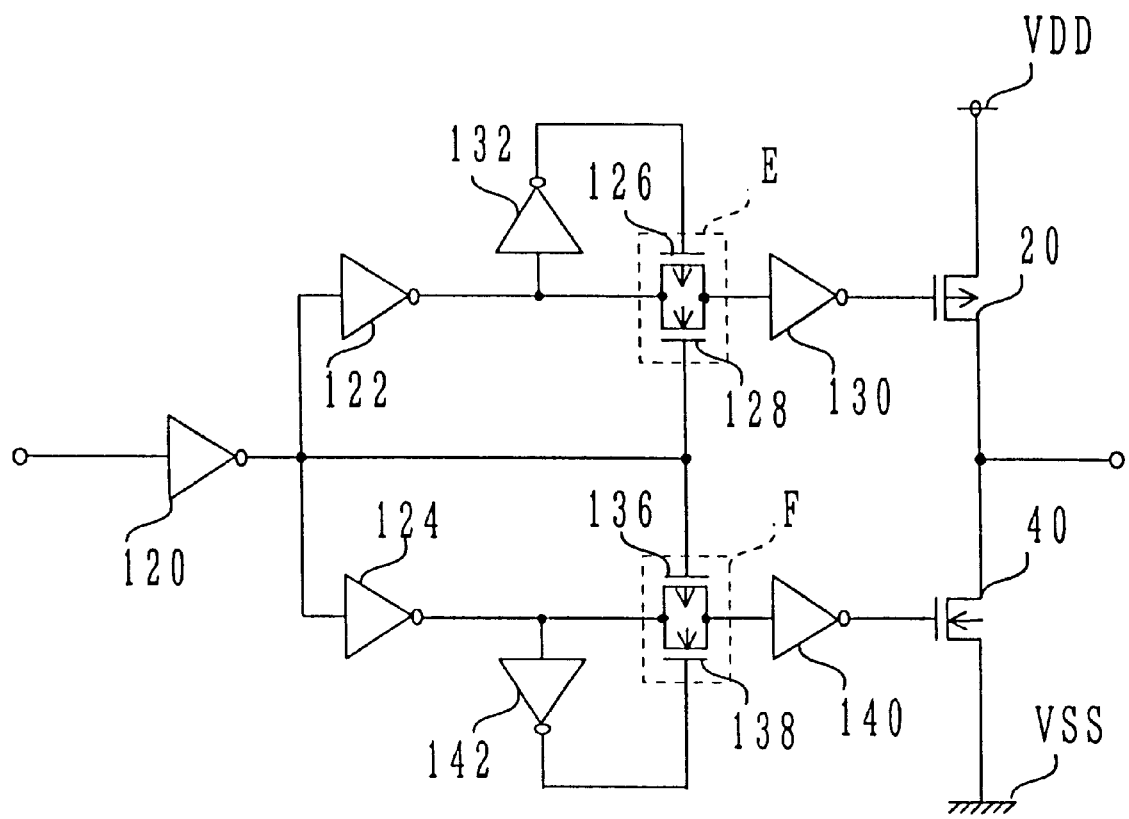
FIG. 4 is an explanatory view for explaining a conventional technology.

An input signal applied to an input terminal IN is shaped with respect to the waveform via the inverter i1 as shown by Signal A of FIG. 2 and applied to the gates of the N-channel MOS transistor 1 and the P-channel MOS transistor 2 and is applied to the input terminals IN1 and IN2 of the first series circuit L1 and the second series circuit L2 after being delayed by the delay circuit d1 as shown by Signal B of FIG. 2.

When the Signal A is at "L", wherein "L" means "low level", at a timing t1, the N-channel MOS transistor 1 and the P-channel MOS transistor 2 are respectively made OFF and ON as shown by Signal N and Signal P of FIG. 2 and the Signal B stays at "L". Both of the outputs from the output terminals OUT1 and OUT2 of the first series circuit L1 and the second series circuit L2 are at "H", wherein "H" means "high level", the P-channel MOS transistor 7 and the N-channel MOS transistor 8 receiving the respective signals are respectively made OFF and ON and the output terminal OUT stays at "L".

Next, at a timing t2, the Signal A is changed to "H" and the N-channel MOS transistor 1 and the P-channel MOS transistor 2 are respectively made ON and OFF. In this case, in the first series circuit L1, the N-channel MOS transistor 3 is made OFF and the P-channel MOS transistor 4 is made ON and the output terminal OUT1 stays at "H" by being drawn to the side of the power source terminal VDD via the P-channel MOS transistor 4 regardless of the ON state of the N-channel MOS transistor 1. Further, in the second series circuit L2, the N-channel MOS transistor 5 is made OFF and the P-channel MOS transistor 6 is made ON. In this case, the output terminal OUT2 is drawn to the substrate potential, or drawn to the side of the power source terminal VSS and becomes "L" since the P-channel MOS transistor 2 drawing the second series circuit L2 to the side of the power source terminal VDD is made OFF by which the N-channel MOS transistor 8 is made OFF. In this case, the P-channel MOS transistor 2 and the N-channel MOS transistor 5 are made OFF and accordingly, the output terminal OUT2 is separated from the power sources VDD and VSS and seems to be brought into a floating state apparently, however, the output terminal OUT2 is held at "L" since there are gate capacitance and wiring capacitance designated by a notation CN for convenience.

Next, at a timing t3, the Signal B is changed to "H" and in the first series circuit L1, the N-channel MOS transistor 3 is made ON and the P-channel MOS transistor 4 is made OFF. Thereby, the output terminal OUT1 is changed to "L" and the P-channel MOS transistor 7 is made ON. Thereby, the output terminal OUT is changed to "H". At this moment, prior to the ON operation of the P-channel MOS transistor 7, at the timing t2, the N-channel MOS transistor 8 has been made OFF and therefore, no feedthrough current flows from the power source terminal VDD to the power source terminal VSS.

Further, in the second series circuit L2, the N-channel MOS transistor 5 is made ON and the P-channel MOS transistor 6 is made OFF and the output terminal OUT2 is drawn to the side of the power source terminal VSS via the N-channel MOS transistor 5. Thereby, the state of the output terminal OUT2 at "L" is changed from a state dynamically held by the gate capacitance and the wiring capacitance to a state held statically by the power source terminal VSS.

Next, at a timing t4, the Signal A is changed to "L" and the N-channel MOS transistor 1 and the P-channel MOS transistor 2 are respectively made OFF and ON. Although at this moment, in the first series circuit L1, the N-channel MOS transistor 3 and the P-channel transistor 4 are respectively made ON and OFF, the output terminal OUT1 is drawn to the substrate potential or drawn to the side of the power source VDD and changed to "H" since the N-channel MOS transistor 1 drawing the first series circuit L1 to the side of the power source terminal VSS is made OFF. Also in this case, the state of the output terminal OUT1 is dynamically held by the gate capacitance and the wiring capacitance designated by a notation CP for convenience. Thereby, the P-channel MOS transistor 7 is made OFF. Further, in the second series circuit L2, the N-channel MOS transistor 5 and the P-channel MOS transistor 6 are respectively made ON and OFF, the output terminal OUT2 has already been in a state where the output terminal OUT2 is connected to the power source terminal VSS via the N-channel MOS transistor 5 and holds the state of "L" regardless of the OFF state of the P-channel MOS transistor 2.

Next, at a timing t5, the Signal B is changed to "L", in the first series circuit L1, the N-channel MOS transistor 3 and the P-channel MOS transistor 4 are respectively made OFF and ON and the output terminal OUT1 is drawn to the power source terminal VDD via the P-channel MOS transistor 4. Thereby, the state of the output terminal OUT1 at "H" is changed from a state dynamically held by the gate capacitance and the wiring capacitance to a state statically held by the power source terminal VDD. In the second series circuit L2, the N-channel MOS transistor 5 and the P-channel MOS transistor 6 are respectively made OFF and ON and the output terminal OUT2 is changed to "H" by being drawn to the side of the power source terminal VDD via the P-channel MOS transistors 2 and 6. Thereby, the N-channel MOS transistor 8 is made ON and the output terminal OUT is changed to "L". Also in this case, after the P-channel MOS transistor 7 has been made OFF at the timing t4, the N-channel MOS transistor 8 is made ON at the timing t5 and accordingly, these transistors are not made ON simultaneously and no feedthrough current is caused.

As described above, according to the embodiment, the feedthrough current can be restrained by a simple constitution of 3 of the inverters and 8 of the transistors.

According to the present invention, the CMOS circuit restraining the feedthrough current can be realized by a small-scaled circuit constitution.

What is claimed is:

1. A CMOS circuit comprising:

a first MOS transistor of a first conductive type having a gate, a drain, a source, an input signal applied to said gate thereof and said source thereof connected to a first power potential;

a second MOS transistor of a second conductive type different from said first conductive type having a gate, a drain, a source, said input signal applied to said gate thereof and said source thereof connected to a second power potential having a potential different from a potential of said first power potential;

a delay circuit for delaying said input signal and thereby producing a delayed input signal;

a first series circuit comprising a third and a fourth MOS transistor of said first and said second conductive types, respectively, said third and fourth MOS transistors having gates and drains respectively connected together, and said delayed input signal from said delay circuit applied to said gates thereof, said third MOS transistor of said first conductive type having a source connected to a drain of said first MOS transistor, said fourth MOS transistor of said second conductive type having a source connected to said second power potential, and said first series circuit having an output terminal comprised of said drains of said third and fourth MOS transistors which are connected to each other;

a second series circuit comprising a fifth and a sixth MOS transistor of said first and said second conductive types, respectively said fifth and sixth MOS transistors having gates and drains respectively connected together, and said delayed input signal from said delay circuit applied to said gates thereof, said sixth MOS transistor of said second conductive type having a source connected to a drain of said second MOS transistor, said fifth MOS transistor of said first conductive type having a source connected to said first power potential, and said second series circuit having an output terminal comprised of said drains of said fifth and sixth MOS transistors which are connected to each other; and a third series circuit including a seventh MOS transistor of said second conductive type having a gate connected to said output terminal of said first series circuit and a source connected to said second power potential, said third series circuit further including an eighth MOS transistor of said first conductive type having a gate connected to said output terminal of said second series circuit and a source connected to said first power potential, and said seventh and eighth MOS transistors having drains connected together to form an output terminal of said third series circuit for outputting an output signal in correspondence with said input signal.

2. A CMOS circuit comprising:

an output stage including first and second MOS transistors of respective first and second conduction types having drains connected together to form an output of said CMOS circuit, sources respectively connected to first and second power potentials which differ from each other, and gates, said first MOS transistor being turned on when said second power potential is applied to said gate thereof, and said second MOS transistor being turned on when said first power potential is applied to said gate thereof;

a delay circuit receiving an input signal and producing a delayed input signal;

a first switch circuit having a control input with said delayed input signal applied thereto, first and second power potential inputs, and a power potential output connected to said gate of said first MOS transistor, said first switch circuit including means for conductively connecting said power potential output alternately to said first power potential input and said second power potential input when said delayed input signal is respectively in said first state and said second state, and said first potential input having said first power potential applied thereto;

a second switch circuit having a control input with said delayed input signal applied thereto, first and second power potential inputs, and a power potential output connected to said gate of said second MOS transistor, said second switch circuit including means for conductively connecting said power potential output alternately to said first power potential input and said second power potential input when said delayed input signal is respectively in said first state and said second state, and said second potential input having said second power potential applied thereto;

a first switch means having a control input with said input signal applied thereto for conductively connecting and disconnecting said second power potential input of said first switch circuit to said second power potential when said input signal is respectively in said second state and said first state; and a second switch means having a control input with said input signal applied thereto for conductively connecting and disconnecting said first power potential input of said second switch circuit to said first power potential when said input signal is respectively in said first state and said second state.

* * * * *